United States Patent
Huang et al.

(10) Patent No.: US 9,226,434 B2
(45) Date of Patent: Dec. 29, 2015

(54) ELECTRONIC DEVICE AND ELECTRICALLY-CONDUCTING ASSEMBLY THEREOF

(71) Applicant: PEGATRON CORPORATION, Taipei (TW)

(72) Inventors: Su-Tai Huang, Taipei (TW); Dun-Wei Su, Taipei (TW)

(73) Assignee: PEGATRON CORPORATION, Taipei (TW)

( * ) Notice: Subject to any disclaimer, the term of this patent is extended or adjusted under 35 U.S.C. 154(b) by 225 days.

(21) Appl. No.: 14/019,974

(22) Filed: Sep. 6, 2013

(65) Prior Publication Data
US 2014/0111918 A1   Apr. 24, 2014

(30) Foreign Application Priority Data

Oct. 24, 2012   (TW) .............................. 101139362 A

(51) Int. Cl.
H05K 7/20    (2006.01)
H05K 9/00    (2006.01)

(52) U.S. Cl.
CPC .................................... *H05K 9/0016* (2013.01)

(58) Field of Classification Search
CPC .................................................. H05K 9/0016
See application file for complete search history.

(56) References Cited

U.S. PATENT DOCUMENTS

| | | | | |
|---|---|---|---|---|
| 5,353,201 A * | 10/1994 | Maeda | .......................... | 361/816 |
| 6,181,573 B1 * | 1/2001 | Riet | .............................. | 361/816 |
| 7,113,410 B2 * | 9/2006 | Pawlenko et al. | ............. | 361/818 |
| 7,534,968 B2 * | 5/2009 | English et al. | ................ | 174/382 |

FOREIGN PATENT DOCUMENTS

| | | |
|---|---|---|
| CN | 101393831 A | 3/2009 |
| JP | 01204499 A | 8/1989 |
| TW | M332365 | 5/2008 |
| TW | M432112 | 6/2012 |

* cited by examiner

*Primary Examiner* — Anthony Q Edwards
(74) *Attorney, Agent, or Firm* — Muncy, Geissler, Olds & Lowe, P.C.

(57) ABSTRACT

An electrically-conducting assembly for conducting a first housing and a second housing of an electronic device. The first housing is detachably combined with the second housing. The electrically-conducting assembly includes a retaining wall and a lapping part. The retaining wall is perpendicularly provided at the first housing, and a surface of the retaining wall has an electrically-conducting layer. The lapping part is perpendicularly provided at the second housing, and a surface of the lapping part has another electrically-conducting layer. The lapping part and the retaining wall contact with each other when the first housing and the second housing are combined so that the electrically-conducting layer and the another electrically-conducting layer are mutually conductive.

8 Claims, 6 Drawing Sheets

ELECTRONIC DEVICE AND ELECTRICALLY-CONDUCTING ASSEMBLY THEREOF

CROSS-REFERENCE TO RELATED APPLICATIONS

This Non-provisional application claims priority under 35 U.S.C. §119(a) on Patent Application No(s). 101139362 filed in Taiwan, Republic of China on Oct. 24, 2012, the entire contents of which are hereby incorporated by reference.

BACKGROUND OF THE INVENTION

1. Field of Invention

The invention relates to an electronic device and, in particular, to an electrically-conducting assembly of an electronic device.

2. Related Art

Generally speaking, an electronic device includes a housing, in which multiple electronic housings or electromagnetic conducing components are disposed. During the operation of the electronic device, electromagnetic waves of a certain degree would be generated. Since the housing is often made of plastics, it is easy for the electromagnetic waves generated during the operation to leak to the outside of the electronic device and interfere with other apparatuses, which makes those apparatuses not be able to function normally or even is harmful to human bodies. Therefore, without EMI (electromagnetic interference) protection measures, not only the operations of other electronic devices may be affected, but also the device itself would be affected by other electronic apparatuses.

Currently the methods of preventing electromagnetic interference include using an electrically-conducting assembly such as a metal sheet or a conductive adjuvant, spraying conductive paints, electroplating, and vacuum sputtering to enhance the electric conductions inside the electronic device and to ensure that the interior of the electronic device is a closed metallic body to prevent the leak of the electromagnetic waves. With these methods, the housing is often processed overall by spraying conductive paints, electroplating, and vacuum sputtering, and electrically-conducting assemblies such as metal sheets or conductive adjuvants are used at the places where different parts of the housing are connected to ensure that effective electric contacts are formed to prevent the leak of the electromagnetic waves generated by the electronic device.

FIG. 1A and FIG. 1B are schematic diagrams of an electrically-conducting assembly for an electronic device in the prior art. As shown in FIG. 1A, the housing 1 of the electronic device is formed by combining a first housing 11 and a second housing 12. An electrically-conducting layer 13 is formed on the first housing 11 by spraying conductive paints, electroplating or vacuum sputtering. (Of course, the second housing 12 may be processed similarly.) A metal sheet 14 is used to ensure the conduction of the circuit (i.e., the circuit of the electromagnetic wave shielding). As shown in FIG. 1B, sputtering may be performed on both surfaces of the first housing 11 to form electrically-conductive layers 13 on the front surface and the back surface of the first housing 11. A metal sheet 14 may be attached to the second housing 12, or a similar sputtering forming the electrically-conducting layer (not shown in the drawing) may also be performed. A conductive adjuvant 15 is used between the first housing 11 and the second housing 12 to ensure the effective electrical contact.

As mentioned above, the housing of the electronic device in the prior art requires additional parts, such as the metal sheet 14 or the conductive adjuvant 15, which increase the assembly working hours. Even using the method of sputtering the electrically-conducting layer 13 without using the conductive material to enhance the circuit conduction, a dual-surface sputtering must be performed to the first housing 11 to form a conductive circuit with the second housing 12, and the dual-surface sputtering also increases manufacturing costs. Therefore, how to design a housing of an electronic that can form effective electric contacts between assembly parts by single-surface sputtering without using other parts to prevent the electromagnetic interference and reduce the material usage and the assembly working hours has become an important issue of the designer and the manufacturer of the housing of the electronic device.

SUMMARY OF THE INVENTION

In view of the above, the invention provides an electrically-conducting assembly suitable for conducting different housings of an electronic device. Effective electric contacts between housings can be formed by single surface sputtering of conductive material only and it is not necessary to use other additional parts. Electromagnetic wave interference can be prevented, while part usages and assembly working hours can be reduced.

To achieve the above-mentioned objective, the invention provides an electrically-conducting assembly for conducting a first housing and a second housing of an electronic device. The first housing is detachably combined with the second housing. The electrically-conducting assembly includes a retaining wall and a lapping part. The retaining wall is perpendicularly provided at the first housing, and a surface of the retaining wall has an electrically-conducting layer. The lapping part is perpendicularly provided at the second housing, and a surface of the lapping part has another electrically-conducting layer. The lapping part and the retaining wall contact with each other when the first housing and the second housing are combined so that the electrically-conducting layer and the another electrically-conducting layer are mutually conductive.

In one embodiment of the invention, the lapping part has an interference part, the interference part is provided at one end of the lapping part away from the second housing to have an interference contact with the retaining wall.

In one embodiment of the invention, the interference part has a curved surface.

In one embodiment of the invention, the lapping part has a hole near the bottom, and the hole is formed adjacent to the second housing.

In one embodiment of the invention, the electrically-conducting assembly further includes at least one support part provided at the second housing for supporting the lapping part.

To achieve the above-mentioned objective, the invention further provides an electronic device, including a first housing, a second housing and an electrically-conducting assembly. The second housing is detachably combined with the first housing. The electrically-conducting assembly is for conducting the first housing and the second housing, and including a retaining wall and a lapping part. The retaining wall is perpendicularly provided at the first housing, and a surface of the retaining wall having an electrically-conducting layer. The lapping part is perpendicularly provided at the second housing, and a surface of the lapping part having another electrically-conducting layer. The lapping part and the retaining wall contact with each other when the first housing and the second housing are combined so that the electrically-conducting layer and the another electrically-conducting layer are mutually conductive.

To sum up, the electrically-conducting assembly and the electronic device using the same may form a closed space inside the electronic device surrounded by conductive material after the first housing and the second housing are combined. The retaining wall and the lapping part of the electrically-conducting assembly are lapped with each other to form an effective electric contact, which can enhance the sealing integrity of the closed space and prevent the leak of the electromagnetic waves.

Compared with the prior art, the retaining wall is perpendicularly provided at the first housing, and the lapping part is perpendicularly provided at the second housing. Therefore, the position at which the retaining wall and the lapping part are lapped with each other is located at vertical wall surfaces. Therefore, the first housing and the second housing only require single-surface sputtering, and it is not necessary to use other conductive material to form an effective electric contact. This reduces the assemble work hours, and can form a complete and closed metallic interior space in the electronic device to prevent the leak of the electromagnetic waves.

DETAILED DESCRIPTION OF THE INVENTION

The electrically-conducting assembly of the electronic device according to an embodiment of the invention will be described hereinbelow with reference to the accompanying drawings, wherein the same references relate to the same elements.

Figure 1A:
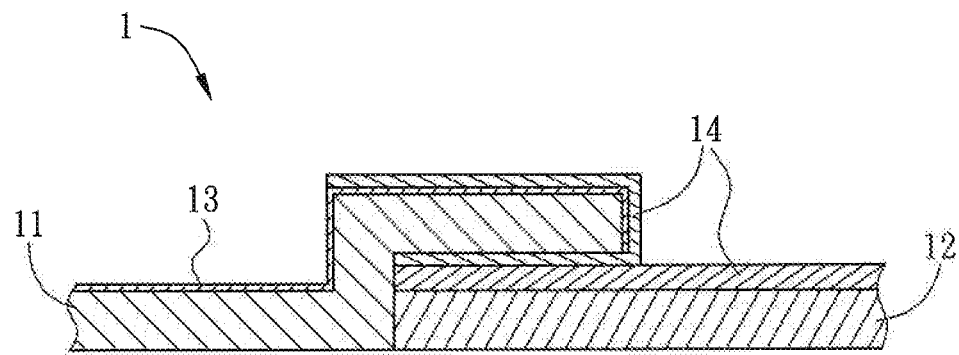
FIG. 1A and FIG. 1B are schematic diagrams showing an electrically-conducting assembly for an electronic device in the prior art.
Figure 1B:
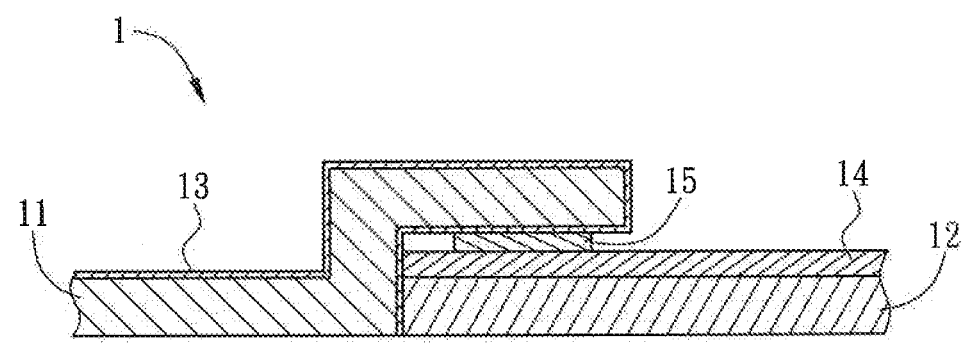
Figure 2A:
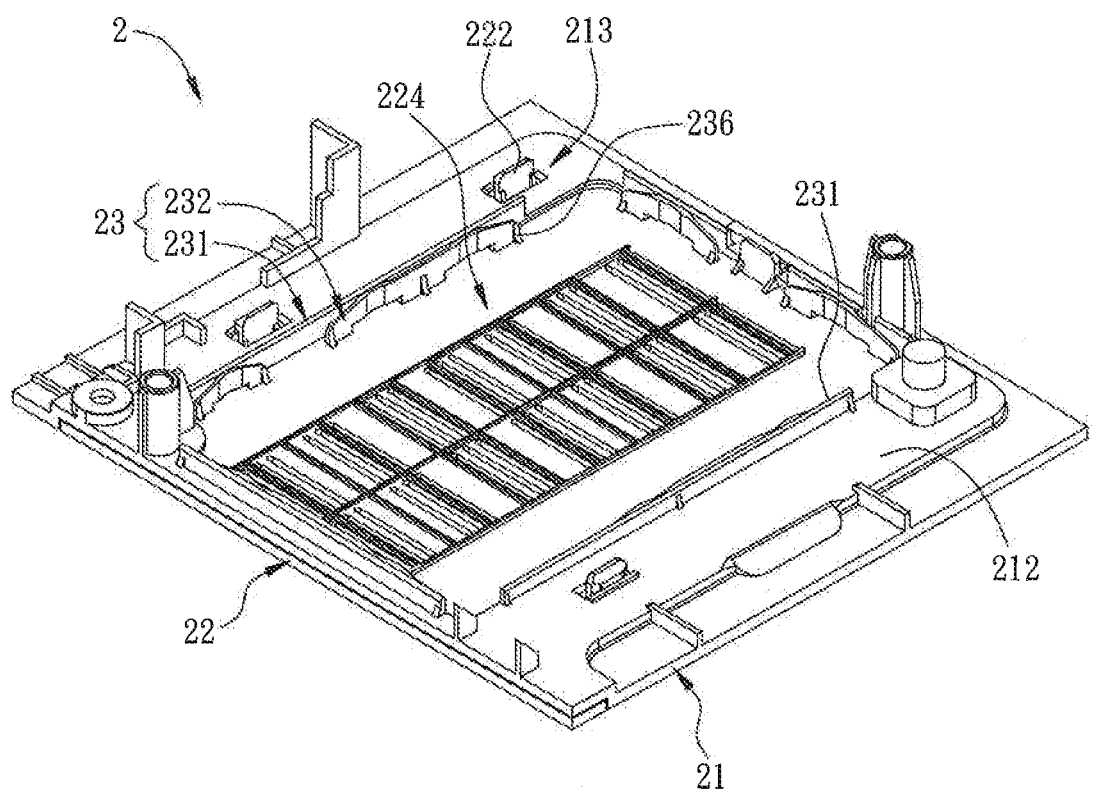
FIG. 2A is a schematic diagram of an electrically-conducting assembly for an electronic device according to a preferred embodiment of the invention.
Figure 2B:
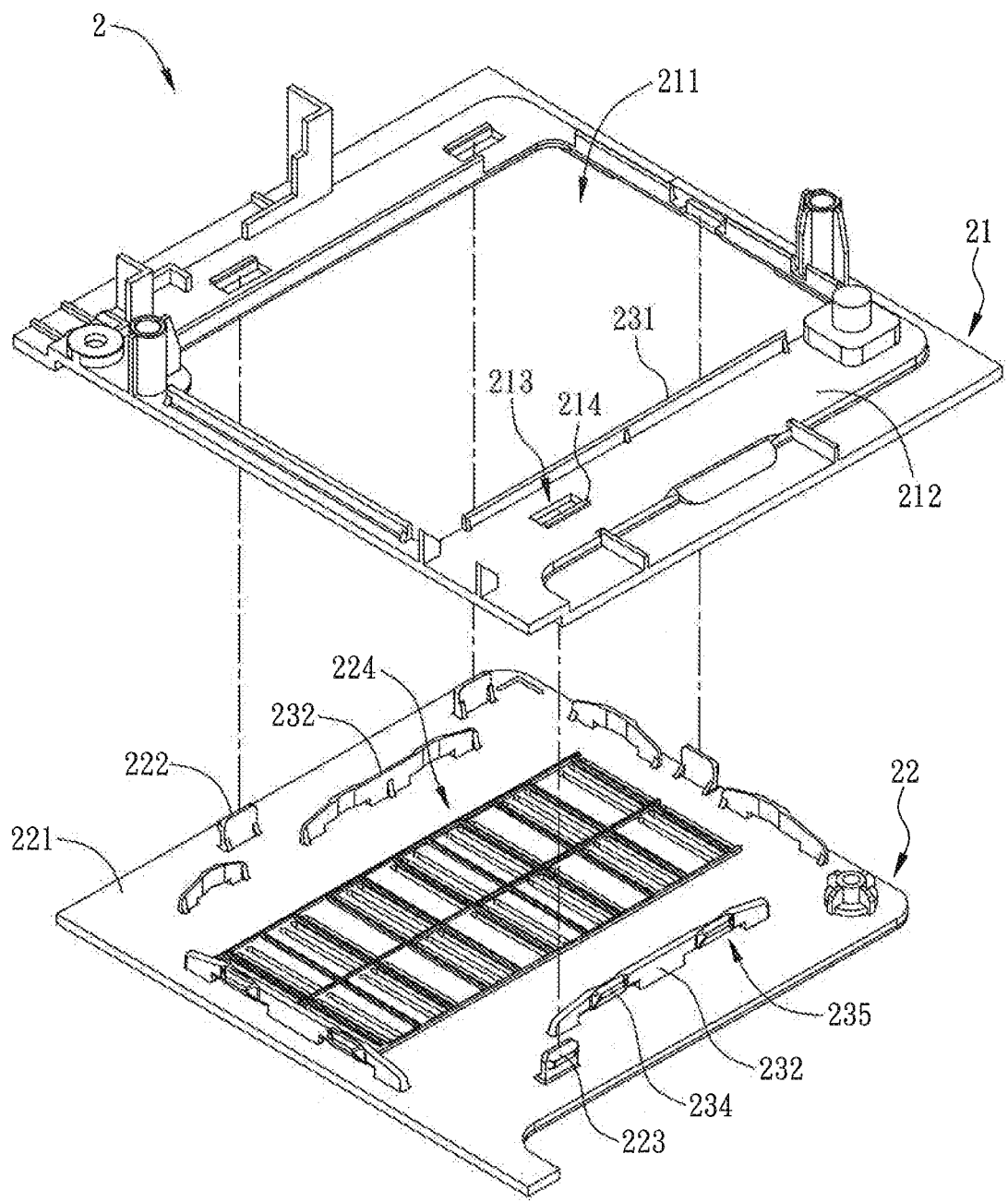
FIG. 2B is an exploded schematic diagram of the electronic device shown in FIG. 2A.

FIG. 2A is a schematic diagram of an electrically-conducting assembly of the electronic device according to an embodiment of the invention. FIG. 2B is an exploded schematic diagram of the electronic device shown in FIG. 2A. Please refer to FIG. 2A and FIG. 2B simultaneously. The electronic device 2 of the embodiment of the invention includes a first housing 21, a second housing 22 and an electrically-conducting assembly 23. It should be noted that for the clarity of the drawings so that the main technical features of the invention are more apparent in the drawings, only those components of the electronic device 2 that are related to the main feature of the invention are shown (i.e., the relevant structure of the substrate/bottom). The electronic device 2 actually has an inner space to accommodate electronic modules.

As shown in FIG. 2B, the electrically-conducting assembly 23 includes a retaining wall 231 and a lapping part 232. The retaining wall 231 is perpendicularly provided at the first housing 21. In detail, the first housing 21 has an opening 211, and the retaining wall 231 is perpendicularly provided at the peripheral of the opening 211. The retaining wall 231 extends along the peripheral of the opening 211 and is provided perpendicularly to the bottom 212 of the first housing 21. Moreover, a lapping part 232 is perpendicularly provided at the bottom 221 of the second housing 22. When detachably combining the second housing 22 with the first housing 21, the second housing 22 is assembled at the opening 211 of the first housing 21, and the lapping part 232 and the retaining wall 231 contact with each other when the first housing 21 is combined with the second housing 22.

Figure 3A:
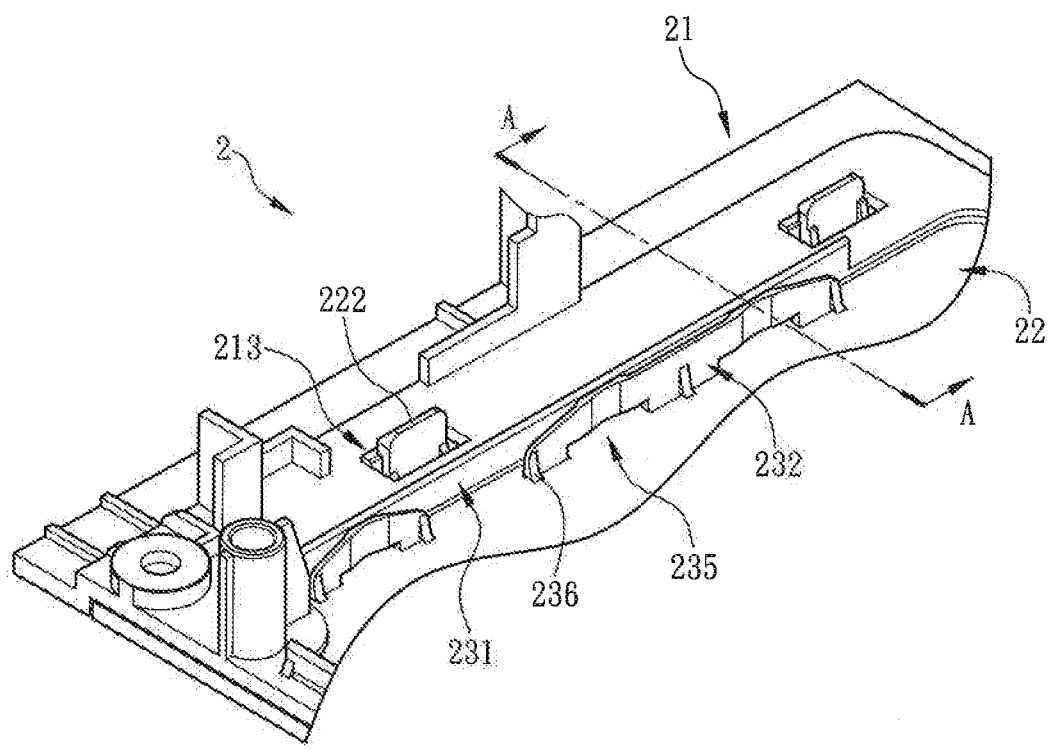
FIG. 3A is an enlarged schematic diagram of the electronic device shown in FIG. 2A.
Figure 3B:
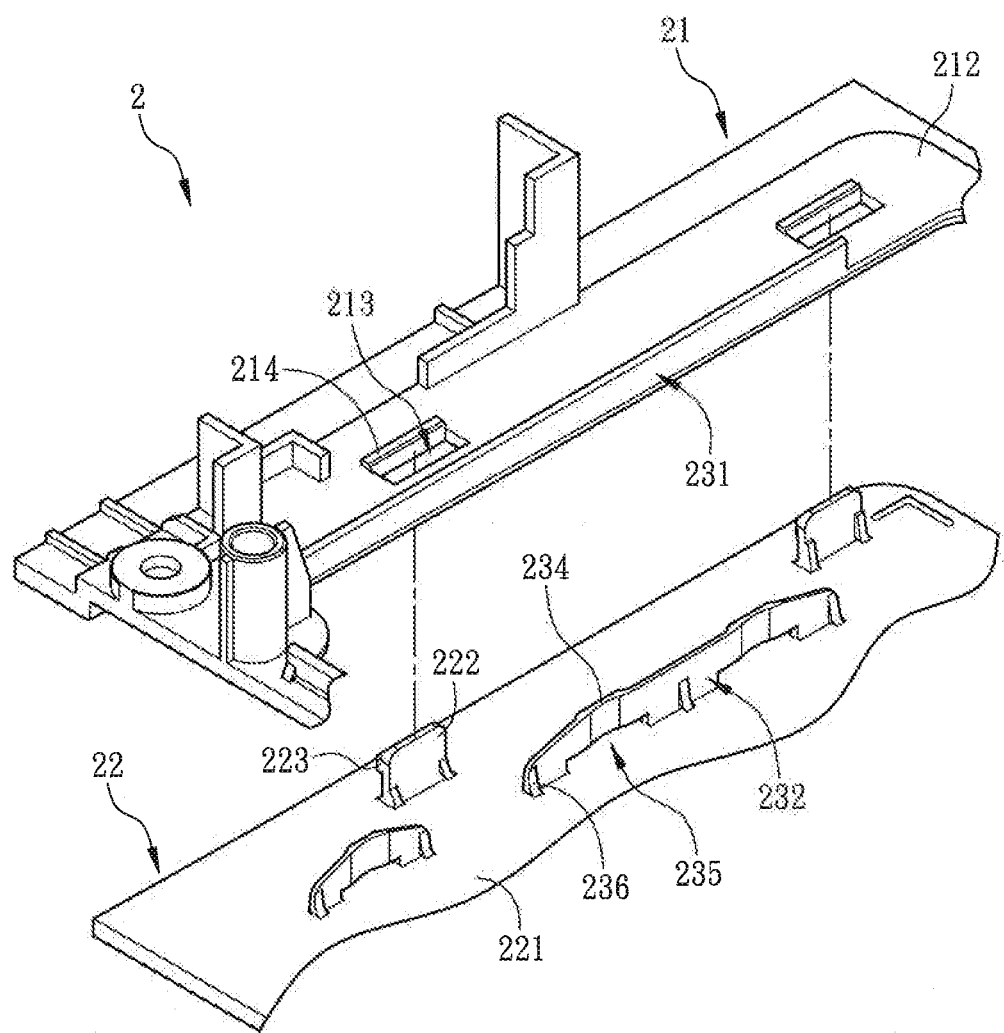
FIG. 3B is an exploded schematic diagram of the electronic device shown in FIG. 3A.
Figure 4:
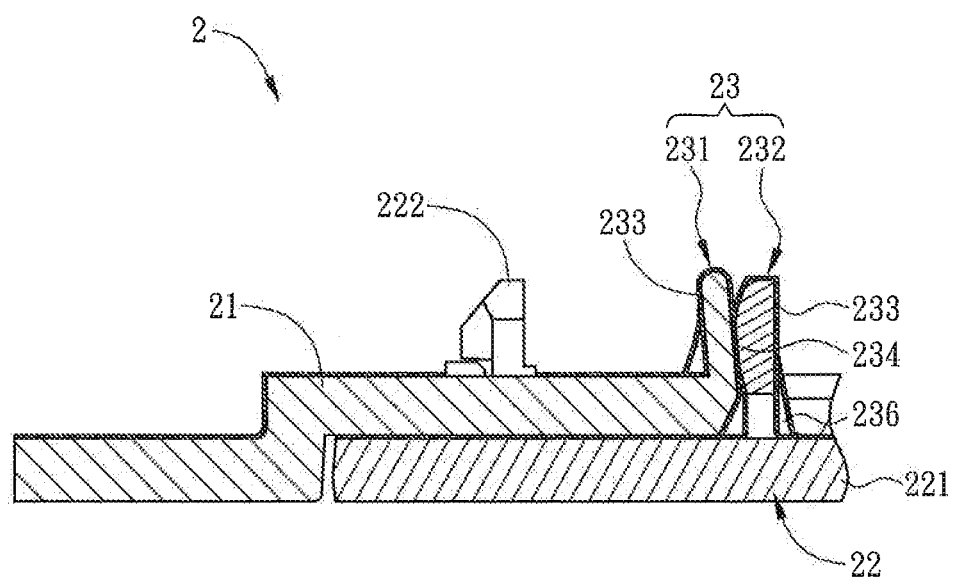
FIG. 4 is a sectional schematic diagram along the A-A line shown in FIG. 3A.

FIG. 3A is an enlarged schematic diagram of the electrically-conducting assembly shown in FIG. 2A, and FIG. 3B is an exploded schematic diagram of the housing of the electrically-conducting assembly shown in FIG. 3A. FIG. 4 is a sectional schematic diagram along the A-A line of FIG. 3A. Please refer to FIG. 3A, FIG. 3B and FIG. 4 simultaneously. The surface of the retaining wall 231 has an electrically-conducting layer 233, and the surface of the lapping part 232 also has another electrically-conducting layer 233 (as shown in FIG. 4). Practically, the retaining wall 231 and the bottom 212 of the first housing 21 may be an integrally-formed structure form by, but not limited to, injection molding. Similarly, the lapping part 232 and the bottom 221 of the second housing 22 may also be an integrally-formed structure (as shown in FIG. 3B). A layer of conductive material may be formed on the surfaces of the first housing 21 and the second housing 22 by, but not limited to, painting, electroplating or vacuum sputtering, and the surface of the electrically-conducting assembly 23 is also sputtered with a layer of conductive material. The retaining wall 231 and the lapping part 232 have electrically-conducting layers 233 respectively (as shown in FIG. 4) so that the electrically-conducting layers 233 are mutually conductive.

Since both the first housing 21 and the second housing 22 have surfaces (the sides having the electrically-conducting assembly) with the conductive material and are combined to form the electronic device 2, the interior of the electronic device 2 is a closed space surrounded by conductive material. The retaining wall 231 and the lapping part 232 contact with each other to form an effective electrical contact, which further enhances the sealing integrity of the closed space and prevents the leak of electromagnetic waves. The type of the conductive material is not limited, and may be any material that can be electrically conductive when the retaining wall 231 and the lapping part 232 contact with each other. For example, the conductive material may be metal such as gold, silver, copper, platinum, aluminum or the compounds thereof.

Furthermore, the retaining wall 231 is perpendicularly provided perpendicular to the bottom 212, and the lapping part 232 is provided perpendicular to the bottom 221. Therefore, the retaining wall 231 and the lapping part 232 contact with each other at vertical wall surfaces. Therefore, the first housing 21 and the second housing 22 only need single-surface sputtering to form an effective electrical contact without additional conductive material, which reduces the working hours of assembling additional parts. The complete and closed metallic interior space of the electronic device 2 can also be formed to reduce to leak of the electromagnetic waves generated during the operation of the electronic modules accommodated in the electronic device 2.

Moreover, the invention does not limit the numbers and lengths of the retaining wall 231 and the lapping part 232, either. The numbers and lengths of the retaining wall 231 and the lapping part 232 may be changed according to the positions of other electronic modules or components provided at the electronic device 2 to make the electronic device 2 have a closed metallic interior space.

Please refer to FIG. 4. The lapping part 232 further includes an interference part 234. The interference part 234 is provided at the end of the lapping part 232 away from the bottom 221 of the second housing 22, so as to be lapped at the retaining wall 231 when the first housing 21 is combined with the second housing 22. Moreover, the interference part 234 may have a curved surface. The interference part 234 having a curved surface allows the conductive material to flow downwardly along the curved surface of the interference part 234 during the single-surface sputtering of the second housing 22, so that the conductive material can cover the interference part 234 completely to prevent the issue of non-conductive of electromagnetic waves due to incomplete sputtering.

Furthermore, since the interference part 234 is not in a shape of a vertical flat surface but a smooth curved surface, when lapped at the retaining wall 231, the interference part 234 can reduce the adverse condition of poor contact between the retaining wall 231 and the interference part 234. If the contact surface of the interference part is a vertical flat surface, the assembly process must be performed precisely to ensure the contact between the flat surface of the interference part and the retaining wall. With the curved surface design the present embodiment, the probability for the interference part 234 to contact with the retaining wall 231 is higher than that with the vertical flat surface design. The curved surface design may also reduce the assembly working hours and enhance the yield rate of the electronic device.

Please refer to FIG. 2B or FIG. 3A and FIG. 3B. The lapping part 232 has a hole 235 near the bottom 221. The hole 235 is formed adjacent to the first housing 21. When the retaining wall 231 laps with the lapping part 232, to ensure an effective electric contact, the retaining wall 231 and the interference part 234 have an interference contact with each other and thus stress is generated. The hole 235 of the lapping part 234 can increase the overall elasticity of the lapping part 232. Moreover, since the hole 235 is located at the underside of the lapping part 232, the lapping part 232 has the space to bend backward (as shown in FIG. 4) to release a portion of the stress and to prevent the retaining wall 231 and the lapping part 232 from being damaged due to the interference contact for a long time.

Furthermore, the design of the hole 235 can increase the overall elasticity of the lapping part 232 and allows the lapping part 232 to have a space to bend backward. However, the invention is not limited therein. For example, a non-hollow structure with a material density smaller than the material density of the interference part 234 can be provided, which can also achieve the objectives of releasing the stress generated due to the interference contact between the lapping part 232 and the retaining wall 231 and extending the lifespans of the retaining wall 231 and the lapping part 232. Preferably, the electrically-conducting assembly 23 may further includes at least one support part 236 (as shown in FIG. 3A and FIG. 3B), which is provided at the second housing. When the lapping part 232 bends backward, the support part 236 supports the lapping part 232 to limit the bending magnitude to ensure the effective electric contact between the retaining wall 231 and the lapping part 232 while increase the strength of the lapping part 232.

Please refer to FIG. 3B. The second housing 22 further has at least one hook 222, and the first housing 21 has at least one hollow portion 213. The hollow portion 213 is provided corresponding to the hook 222. An engagement part 214 is provided at the periphery of the hollow portion 213, and the hook 222 has a convex part 223. When the first housing 21 is combined with the second housing 22, the hook 222 may pass through the hollow portion 213 and engaged with engagement part 214 through the convex part 223 to fix the first housing 21 to the second housing 22. Such design prevents the poor contact between the retaining wall 231 and the lapping part 232 of the electrically-conducting assembly 23 that results in the leak of electromagnetic waves due to the incomplete metallic interior space. Certainly, the aspect and engagement type of the hook 222 is not limited so long as the first housing 21 and the second housing 22 can be combined firmly.

As shown in FIG. 2A, the second housing 22 may further have a heat dissipation opening 224 to dissipate the heat generated due the operation of the electronic modules inside the electronic device 2 to enhance the heat dissipation efficiency.

Moreover, the invention further proposes an electrically-conducting assembly for conducting a first housing and a second housing of an electronic device. The electrically-conducting assembly includes a retaining wall and a lapping part. The retaining wall is perpendicularly provided at the first housing. The lapping part is perpendicularly provided at the second housing. When the first housing is combined with the second housing, the lapping part and the retaining wall are lapped with each other. The electrically-conducting assembly disclosed herein may correspond to the electrically-conducting assembly of the electronic device disclosed previously, the structures and features of which are omitted for concise purpose.

To sum up, the electrically-conducting assembly and the electronic device using the same may form a closed space inside the electronic device surrounded by conductive material after the first housing and the second housing are combined. The retaining wall and the lapping part of the electrically-conducting assembly are lapped with each other to form an effective electric contact, which can enhance the sealing integrity of the closed space and prevent the leak of the electromagnetic waves.

Compared with the prior art, the retaining wall is perpendicularly provided at the first housing, and the lapping part is perpendicularly provided at the second housing. Therefore, the position at which the retaining wall and the lapping part are lapped with each other is located at vertical wall surfaces. Therefore, the first housing and the second housing only require single-surface sputtering, and it is not necessary to use other conductive material to form an effective electric contact. This reduces the assemble work hours, and can form a complete and closed metallic interior space in the electronic device to prevent the leak of the electromagnetic waves.

Moreover, the lapping part may have a interference part with a curved surface, which allows the conductive material to flow downwardly during the single-surface sputtering of the second housing, so that the conductive material can fully cover the interference part to prevent the non-conductive of the electromagnetic waves due to incomplete sputtering. The curved surface design of the interference part may further effectively reduce the poor contact with the retaining wall. If the contact surface of the interference part is a vertical flat surface, the assembly process must be performed precisely to ensure the contact between the flat surface of the interference part and the retaining wall. Therefore, the curved surface design also reduces the assembly work hours and enhances the yield rate of the electronic device. The lapping part is partially hollowed so that the lapping part has a space to bend backward to release a part of the stress to prevent the damage of the retaining wall and the lapping part due to the interference contact for a long time.

Although the invention has been described with reference to specific embodiments, this description is not meant to be construed in a limiting sense. Various modifications of the disclosed embodiments, as well as alternative embodiments, will be apparent to persons skilled in the art. It is, therefore, contemplated that the appended claims will cover all modifications that fall within the true scope of the invention.

What is claimed is:

1. An electrically-conducting assembly for conducting a first housing and a second housing of an electronic device, the first housing being detachably combined with the second housing, the electrically-conducting assembly comprising:
   a retaining wall perpendicularly provided at the first housing, a surface of the retaining wall having an electrically-conducting layer; and
   a lapping part perpendicularly provided at the second housing, a surface of the lapping part having another electrically-conducting layer, the lapping part and the retaining wall contacting with each other when the first housing and the second housing are combined so that the electrically-conducting layer and the another electrically-conducting layer are mutually conductive, wherein the lapping part has a hole, the hole is formed adjacent to the second housing.

2. The electrically-conducting assembly according to claim 1, wherein the lapping part has an interference part, the interference part is provided at one end of the lapping part away from the second housing to have an interference contact with the retaining wall.

3. The electrically-conducting assembly according to claim 2, wherein the interference part has a curved surface.

4. The electrically-conducting assembly according to claim 1, further comprising at least one support part provided at the second housing for supporting the lapping part.

5. An electronic device, comprising:
   a first housing;
   a second housing detachably combined with the first housing; and
   an electrically-conducting assembly for conducting the first housing and the second housing, the electrically-conducting assembly comprising:
      a retaining wall perpendicularly provided at the first housing, a surface of the retaining wall having an electrically-conducting layer; and
      a lapping part perpendicularly provided at the second housing, a surface of the lapping part having another electrically-conducting layer, the lapping part and the retaining wall contacting with each other when the first housing and the second housing are combined so that the electrically-conducting layer and the another electrically-conducting layer are mutually conductive, wherein the lapping part has a hole, the hole is formed adjacent to the second housing.

6. The electronic device according to claim 5, wherein the lapping part has an interference part, the interference part is provided at one end of the lapping part away from the second housing to have an interference contact with the retaining wall.

7. The electronic device according to claim 6, wherein the interference part has a curved surface.

8. The electronic device according to claim 5, wherein the electrically-conducting assembly further comprises at least one support part provided at the second housing for supporting the lapping part.

* * * * *